United States Patent [19]

Livshits et al.

[11] 4,404,059

[45] Sep. 13, 1983

[54] PROCESS FOR MANUFACTURING PANELS TO BE USED IN MICROELECTRONIC SYSTEMS

[76] Inventors: Vladimir I. Livshits, Izmailovsky bulvar, 55/16, kv. 3; Vladimir I. Golovin, Uralskaya ulitsa, 6, korpus 3, kv. 47; Vladimir I. Meshkov, ulitsa Martenovskaya, 19/38, kv. 3, all of Moscow, U.S.S.R.

[21] Appl. No.: 382,407

[22] Filed: May 26, 1982

[51] Int. Cl.$^3$ .............................. C23F 1/02; B44C 1/22; C03C 15/00; C03C 25/06
[52] U.S. Cl. ........................................ 156/629; 29/846; 156/151; 156/630; 156/634; 156/651; 156/656; 156/902; 174/68.5; 204/15
[58] Field of Search ................................ 156/629–634, 156/644, 650, 651, 652, 654–656, 659.1, 661.1, 901, 902, 151; 174/68.5; 204/15; 29/831, 832, 834, 836, 841, 846, 852, 855, 856

[56] References Cited

U.S. PATENT DOCUMENTS 3,801,388  4/1974  Akiyama et al. ..................... 156/656
4,052,787  10/1977  Shaheen et al. ................. 156/631 X Primary Examiner—William A. Powell
Attorney, Agent, or Firm—Burgess, Ryan & Wayne

[57] ABSTRACT

The herein disclosed process comprises forming conductors of desired shape on a substrate comprised of a metal that is selectively etchable with respect to the metal of conductors, such that the conductors are formed on both sides of the substrate and that the conductors have at least one constricted portion at the substrate side opposite to that on which a base will be laminated. Then, the panel base is laminated onto the appropriate side of the substrate, and the substrate metal is etched selectively with respect to the conductor metal through the entire thickness of the substrate until the metal of the latter is fully removed from under the constricted portions only.

5 Claims, 5 Drawing Figures

PROCESS FOR MANUFACTURING PANELS TO BE USED IN MICROELECTRONIC SYSTEMS

FIELD OF THE INVENTION

The present invention relates to processes for manufacturing double-layer or multi-layer printed circuit boards.

Panels manufactured by this process may be used as a basis for developing microelectronic systems of various degrees of structural complexity, including hybrid integrated circuits, functional modules, units and apparatuses incorporating integrated circuits.

BACKGROUND OF THE INVENTION

The manufacture of microelectronic systems calls for joining together large numbers of chips with quite a few (on the order of several dozens) external leads. This problem is further aggravated by the fact that the number of external leads employed in integrated circuits has been growing in recent years, with this process being expected to continue until single-chip microelectronic systems gain wide acceptance. It is doubtful, however, that such acceptance can be gained in the nearest future, and the need to join together multi-lead instruments will be growing. In order to efficiently solve this problem, a circuit panel with at least two levels of wiring needs to be developed.

Of key importance to any process for manufacturing circuit panels with multi-level wiring is the technique of manufacturing crossovers, i.e., wiring conductors which intersect in the overall wiring structure without being connected with each other, and contacts between individual wiring levels.

Most extensively used at present are processes for manufacturing circuit panels, enabling one to obtain conductors at different levels of wiring separated by means of dielectric at crossovers, said conductors contacting, where necessary, via holes in dielectric that are filled partly or fully with a conducting medium.

Such processes include processes for manufacturing double sided and multi-layer printed-circuit boards with metallized holes, thick-film and multi-layer ceramic techniques, as well as newly developed processes for manufacturing multi-layer bases of thin layers of organic dielectric pressed on a metal substrate characterized by a low coefficient of thermal expansion (cf., Ch.L. Lassen, Wanted: a New Interconnection Technology Electronics, vol. 52, No. 20, 1979, pp. 113–121).

Common to all of the afore-listed processes is the technique of successively building up layers on a dielectric base in which holes are made in one way or another and said holes are filled with conducting medium. Therefore, a large number (up to several thousand) of holes need to be provided in the board structure in required spots and said holes are to be metallized in some manner for providing therein electrical contacts between different levels of wiring. This stage of the manufacturing process is the most labor-consuming one and causes the most rejects in manufacture and failures in the course of board operation, due to difficulties involved in ensuring a high reliability of interlevel contacts. Even in the case of progressive drilling techniques such as laser drilling, this operation remains most complicated, calls for a high accuracy of blank positioning and requires the use of costly equipment.

While it is sometimes possible to make holes and metallize them in groups, as in multilayer ceramic structures or in the case of using the techniques of mask printing of conducting the dielectric layers, the resulting conductors prove inadequate for some applications, there is observed a loss of accuracy of board dimensions and relative position of contact pads, as well as an increase of electrical capacitances and interconnections between conductors in the wiring (cf., M. L. Topfer, Thick-Film Microelectronics, Van Nostrand Reinhold Company, New york, 1971).

Even though circuit panels with beam jumpers on metal supports satisfy a wide range of requirements placed upon hybrid integrated circuits and microelectronic systems of other types, owing to their mechanical and electrical properties, crossovers of this type can presently find no extensive application. This is due to the peculiarities of the existing technology of manufacturing beam jumpers, which involves twenty production steps (cf., C. E. Iowett, The Engineering of Microelectronic Thin and Thick Films, London, 1976).

Such a complexity and labor-consuming nature of this process are due to the fact that the height of crossovers depends upon the auxiliary titanium-copper-titanium layer obtained by sputtering and electro-plating, applied on top of the main level of wiring and fully removed later on by etching. Holes for supports are formed in the auxiliary layer by photolithography and etching, after which a port for crossover beam is formed in a layer of photoresist and the crossover proper is formed by electroplating of gold. This technology is only suitable for manufacturing small-size boards on rigid bases, this restricting the scope of its possible application.

As regards the manufacture of large-area circuit panels, better possibilities are offered by a metal substrate inasmuch as metal is totally free of shrinkage which is to some degree inherent in flexible dielectric of all types.

There is known in the art a process for manufacturing panels for hybrid integrated circuits, which involves the use of a metal substrate (cf., Japanese Patent No. 52-551, class 99(5) C 21, of 1977). In said process, film conductors and circuit elements are formed by conventional means on one side of a copper or iron substrate and interconnection components are assembled, whereupon this side of the substrate is potted with epoxy resin. Then, photolithography and etching are performed over the backside of the substrate to form support elements which are further used as leads.

Said prior art process is primarily disadvantageous in that the manufacture of crossovers is complicated and labor-consuming, because the process as such only provides a single level of wiring and offers no solution to the problem of making crossovers without resorting to the afore-described conventional techniques.

Further known in the art is a process for manufacturing a lead frame for an electronic instrument, which is a particular case of circuit panel manufacture (cf., Japanese Patent No. 48-36111, class 99(5) C 21, of 1974). According to said process, on a substrate there are formed conductors of required shape from a metal that is selectively etchable with respect to the metal of the conductors, the board base is laminated on one side of the substrate, and the latter is etched over the entire thickness thereof selectively with respect to the conductors.

Said process further comprises applying masking layers lying opposite expanded portions of the conductors onto the metal substrate on the side opposite from the conductors, after which the etching reagent etches everything, but the conductors and metal substrate portions protected by masking layers. As a result, the support elements formed by the metal substrate are separated from each other and connected to narrow portions of the conductors formed of deposited metal.

Said prior art process, like the former one, suffers from the complexity and labor-consuming nature of the manufacture of crossovers and, accordingly, of boards required to develop modern microelectronic systems.

Therefore, prior art processes appear to be primarily aimed at solving one of the two problems involved in the development of circuit panels for use in microelectronic systems: developing a large-area panel featuring a low density of interconnections in the wiring (some or other variety of printed circuit board), or developing a panel featuring a small area but a high density of interconnections in the wiring (some or other variety of microcircuit). Consequently, circuit panels of at least two types are widely used in microelectronic systems characterized by high degree of structural complexity, i.e., integrated circuits are assembled in microcircuits which are mounted, together with auxiliary elements, on a printed circuit board. In so doing, one cannot but pass through two stages in the manufacture of microelectronic systems and employ the manufacturing technology of two different types, namely, the technology of printed circuit board manufacture and hybrid-film technology, which is a serious disadvantage resulting from the present state of art with regard to interconnection techniques.

SUMMARY OF THE INVENTION

It is an object of the present invention to develop a process for manufacturing panels to be used in microelectronic systems, that would help combine the techniques of manufacturing microcircuit boards and printed circuit boards in a single technology of manufacturing circuit panels with at least two levels of wiring.

It is another object of the invention to expand the technical capabilities of the herein disclosed process such as to render it applicable for the manufacture of large-size panels employing the base of any type such as rigid, flexible, flexible-rigid or a base with built-in heat dissipator.

It is still another object of this invention to improve the reliability of circuit panels and their resistance to thermal and mechanical effects.

It is yet another object of the invention to reduce the cost of the panels owing to the minimization of the amount of labor consumed in the course of their manufacture and discontinuation of the use of large amounts of costly materials.

It is a further object of the present invention to reduce the overall dimensions and weight of microelectronic systems by increasing, as compared to printed circuit boards and boards manufactured by thick-film techniques, the layout density of conductors on the panel surface.

The afore-listed objects are attained owing to the fact that in a process for manufacturing panels to be used in microelectronic systems, which comprises forming conductors of a desired shape, on a substrate made from a metal that is selectively etchable with respect to the metal conductors, laminating the panel base onto one side of the substrate and etching the substrate through the entire thickness thereof selectively with respect to the conductors. According to the present invention, the conductors are formed on both sides of the substrate while on the substrate side opposite to that on which the base is laminated conductors are formed having at least one constricted portion, the selective etching of the substrate being effected until the metal of the latter is fully removed from under the constricted portions only.

In order to provide crossing-over conductors, the appropriate conductors on the substrate side on which the base is laminated can be formed on the portions of the substrate surface which lie opposite the respective constricted portions of crossing-over conductors.

It is expedient that the conductors having at least one constricted portion be formed such that the width of their most constricted portion be commensurable with the thickness of metal substrate and amount to less than half of the width of portions of the conductors at places of their interconnection with other conductors connected therewith.

It is expedient that, prior to lamination of the base, the metal substrate be etched, selectively with respect to the conductors, to a depth selected in the range of from 0.01 to 0.5 of the width of conductors; in so doing, it is expedient that the metal substrate together with the conductors formed thereon be annealed.

Use can be made of copper, iron, aluminum or alloys thereof as the substrate metal, and of nickel, copper, tin, gold or combinations thereof as the conductor metal.

At least one layer of dielectric material is formed between the substrate and panel base in the course of lamination of the latter and, in so doing, it is expedient that said layer be formed with holes provided in the panel areas designed to accommodate thermal elements of the microelectronic system and/or interconnections with the subsequent layer.

It is technically most efficient that the base proper be formed from metal, from a prefabricated board, or from a metal substrate with conductors according to the disclosed process formed thereon.

The herein disclosed process for manufacturing panels combines the techniques of manufacturing microcircuit boards and printed circuit boards in a single technology of manufacturing circuit panels with more than two levels of wiring, while simultaneously expanding the technical capabilities of the process.

BRIEF DESCRIPTION OF DRAWINGS

Other objects and advantages of this invention will be made apparent upon considering the following detailed description of examplary embodiments thereof, with due reference to the accompanying drawings in which.

DETAILED DESCRIPTION OF THE INVENTION

The herein disclosed process for manufacturing panels to be used in microelectronic systems comprises, as the initial step, forming conductors of desired shape on a substrate a metal that is selectively etchable with respect to the metal of the conductors.

There are two ways of forming such conductors, of which the first one involves selectively removing the conductor metal pre-applied over the entire surface of the substrate, and the second—selectively electroplating the conductor metal through a protective mask of desired shape covering the substrate. The advantage of the former technique resides in the possibility of using prefabricated bimetallic laminates prepared by metallurgical cladding techniques, however, the resulting conductors suffer from the irregularity of edges and low reproducibility of shape. The latter technique is more efficient than the former one from the standpoint of conductor metal consumption and helps attain a higher density of the conducting pattern of the panel; therefore, all further references will be made to the latter one of the two techniques.

Figure 1:
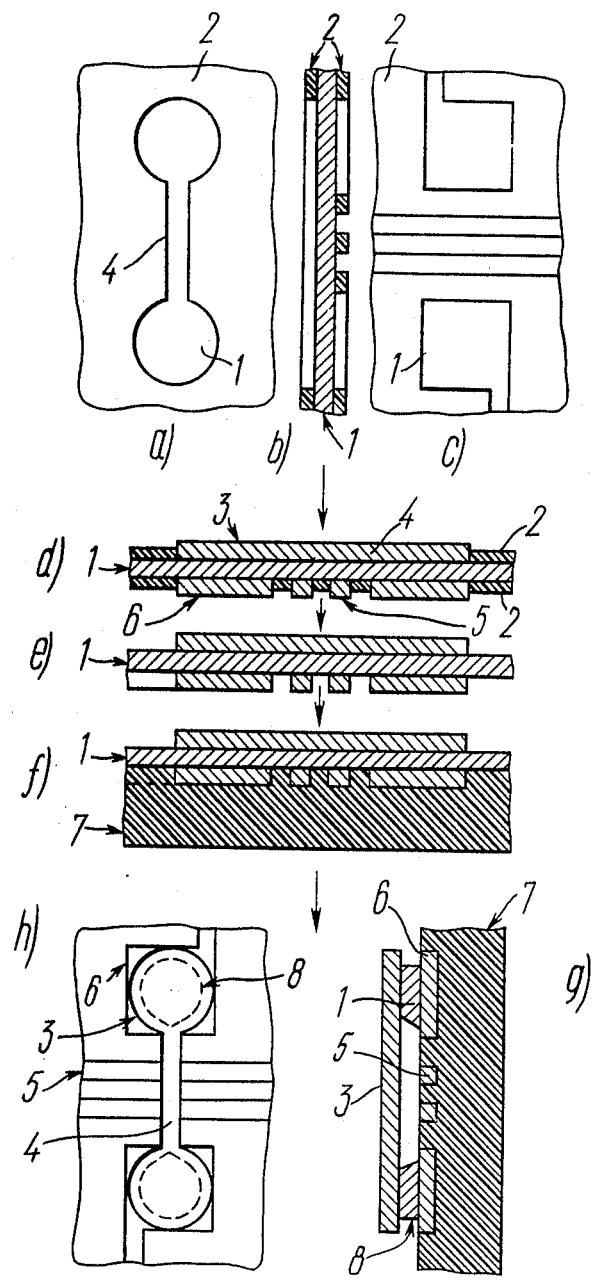
FIGS. 1a, b, c, d, e, f, g, h illustrates the various stages of the process for manufacturing panels, according to the invention.

In this manner, the conductor metal is electroplated (FIG. 1d) onto a metal substrate 1 through a protective mask 2 of required shape formed of, say, photoresist by two-side photolithography over the substrate 1 (FIGS. 1a, b, c). The electroplating of conductors is done on both sides, a conductor 3 on one of the sides of the substrate 1 being provided with a constricted portion 4 imparting said conductor the shape of a dumb-bell. Conductors 5 and 6 of the main level of wiring, crossing over the conductor 3, are positioned on the opposite side of the substrate 1 and, at the point where the conductors 6 are to be interconnected with the conductor 3, the latter is at least doubled in width, for example, by imparting the shape of disks to its ends. The conductors 5 insulated electrically from the conductor 3 at the point of crossover are made opposite to the constricted portion 4 of the conductor 3.

After forming the conductors 3 to 6, the protective mask 2, no longer needed, is removed (FIG. 1e), and a panel base 7 is laminated (FIG. 1f) onto the substrate 1 on the side of the conductors 5 and 6 of the main level of wiring. The operation of lamination of the base 7 needs to be considered separately and will be discussed in more detail below whereas, in order to grasp the essence of the disclosed process, we shall assume that the base 7 is a dielectric plate pressed onto the substrate 1.

The resulting structure is etched through the entire thickness of the substrate 1 in a solution capable of selective action on the substrate metal only. The electrical insulation of the conductors 3 and 5 is ensured owing to the fact that the etching reagent acts both in depth and sidewise, i.e. owing to side etching. As a result of in-depth etching, the conductors 5 and 6 of the main level of wiring contained between the substrate 1 and the base 7 are stripped open and insulated from each other, while side etching causes the edges of the conductor 3 of the second level of wiring to hang over the surface of the base 7. Since the width of the constricted portion 4 of the conductor 3 has been selected to be commensurate with the thickness of the substrate 1, the constricted portion 4 will freely hang over the surface of the base 7 (FIG. 1g), thereby breaking undesired contacts at the point of crossover. At the same time, support elements 8 remain under the terminations of the conductor 3, in the form of stacks of the metal of the substrate 1, said support elements ensuring the interconnection of the conductor 3 with the conductors 6 of the main level of wiring. As a result, the crossover of the conductors 5 and 6 will be effected by means of the conductor 3.

It is preferred that the width of the constricted portion 4 of the conductor 3 amount to less than half its width at places of interconnection with the conductor 6 since, otherwise, the reproducibility of dimensions of the support elements 8 will not be ensured.

As a result of etching, the panel structure assumes the form shown in FIG. 1h. If required, the air gap between the conductors 3 and 5 may be filled with dielectric in the course of sealing the microelectronic system.

Since the conductors 5 and 6 of panels manufactured by the herein disclosed process are only held fast by forces of adhesion of their metal to the panel base 7, the resistance of such a structure to thermal and mechanical loads in some systems may prove inadequate.

With a view to improving the reliability of manufactured panels and their resistance to external effects, the total time of etching the metal substrate is broken in two stages, the first one of said stages (pre-etching) being carried out prior to lamination of the base, and the second stage (etching across the whole thickness)-following the lamination of the base, allowing for the time of pre-etching at the first stage. The composition of etching reagent and conditions of etching at both stages may be identical.

Figure 2:
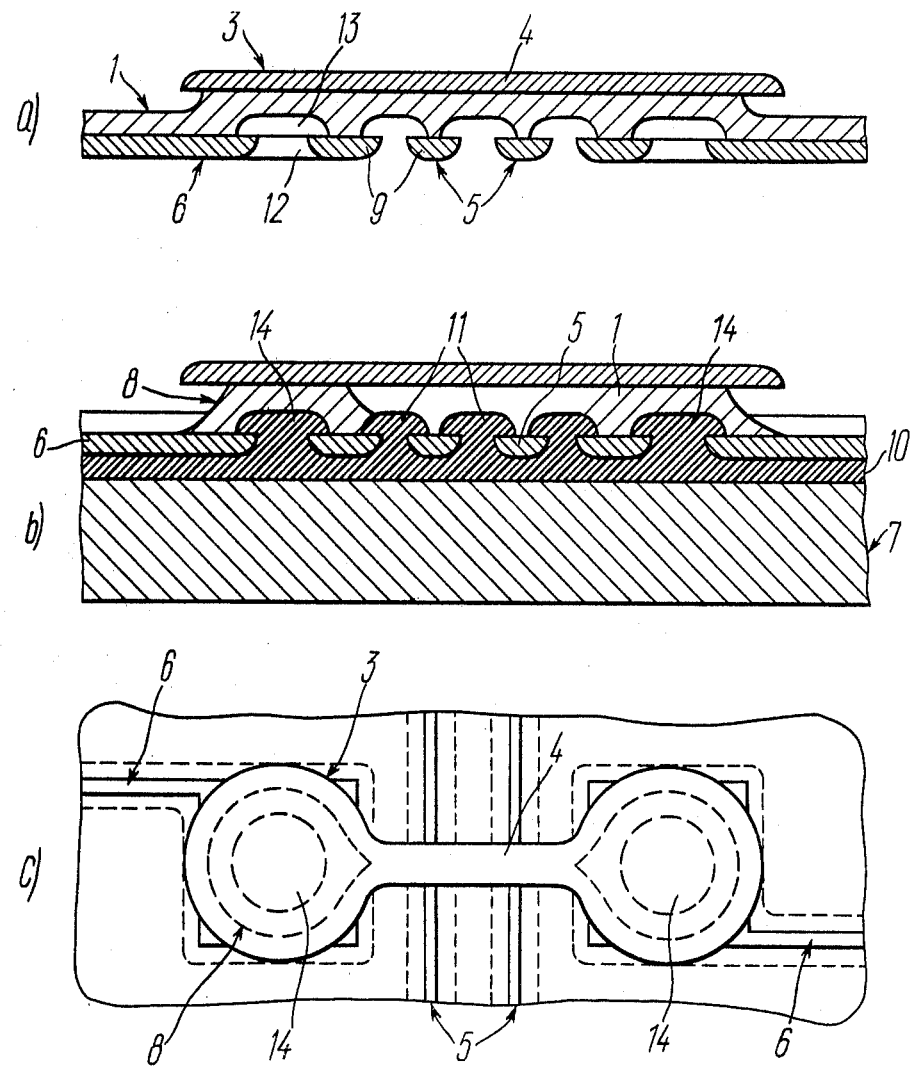
FIGS. 2a, b, c illustrates the steps involved in the lamination of the panel base, according to the invention.

The first stage results in the projection of all of the conductors, including the conductors 5 and 6, in relief above the surface of the metal substrate 1 (FIG. 2a). Of most significance is the emergence of overhanging edges 9 in the conductors 5 and 6, under which a layer 10 of dielectric material flows in the course of lamination of the base 7 to provide for the envelopment of the edges of appropriate conductors (FIG. 2b). Following the etching of the substrate 1, the conductors 5 and 6 are held fast to the surface of the panel both by the forces of adhesion of their metal to the dielectric material of the layer 10 and by virtue of mechanical strength of ridges 11 of the same dielectric material formed as a result of its flowing under the overhanging edges 9 of the conductors 5 and 6 (FIG. 2c). The latter component of the holding force is bulk by nature and, therefore, much less susceptible to external effects than the former one. Moreover, in the case of constricted conductors, it is several times higher than the force of adhesion. This results in a manifold increase in the value of force required to separate the conductors 5 and 6 from the panel.

Along with the afore-mentioned effect, such a structure helps reduce to a minimum the harmful leakages and electromigration between the conductors 5, 6 of the panel, said processes occurring actively at the conductor edges where the highest potential gradients are concentrated. In the case of the structure shown in FIGS. 2b, c, the ridges 11 of dielectric material serve to obstruct such processes. This leads to an increase of the maximum permissible voltage which can be applied between the adjacent conductors 5, 6.

The contribution of bulk component to the resultant force of holding the conductors 5, 6 on the surface of the panel starts showing up at the value of the overhanging edge width of at least 0.01 of the conductor width. Since it is difficult to control the value of overhanging throughout the first stage of etching, one should establish the relationship between said value and the depth of pre-etching the metal substrate 1. Upon etching in a stationary solution, both said values are rather close and, therefore, the former value can be related to the depth of pre-etching which is much easier to control.

On the other hand, it is necessary that the adhesion of the conductors 5, 6 with the substrate 1 be maintained in order to preclude their separation and shifts upon subsequent operations. To this end, the depth of pre-etching should not exceed 0.45 of the minimum conductor width. When etching in a stationary solution, a jumper having a width equal to at least 0.1 of the conductor width will be maintained between the conductors 5, 6 and the substrate 1, which is practically sufficient.

In the case of special etching modes such as jet and powderless etching, when the relationship between the depth of etching and side pre-etching varies towards the prevalence of the former, the upper limit may be raised, however, it is inexpedient to increase the depth of pre-etching to more than 0.5 of the conductor width.

Under conditions of rigid requirements upon the reliability of interlevel contact and mechanical strength of crossovers, the metal substrate 1 with the conductors 3–6 formed thereon (FIG. 2a) should be subjected, prior to lamination of the base 7, to annealing in order to facilitate diffusion welding of the substrate and conductor metals. This is accompanied with an improvement of the crystalline structure and relief of mechanical stresses in the conductor metal which becomes more pliable. This further results in a higher resistance of panels to thermal and mechanical effects, when the difference between the coefficients of thermal expansion of the base 7 and conductors 3 provides reason for the separation of the latter from the support elements 8. The possibility of rupture of the basis material of the conductors 3–6 is ruled out owing to the increased pliability of their metal after annealing.

On the other hand, the increased pliability of the constricted portion 4 of the conductor 3 calls for more care in handling the panel until the air gaps of crossovers are filled with dielectric material. However, the possibility of short-circuiting between the levels of wiring is ruled out because the constricted portions 4 of the conductors 3, when sagging to touch the panel surface, will come in contact with the ridges 11 of dielectric material 10 rather than with the conductors 5 of the main level of wiring.

In order to better secure the support elements 8 in the layer 10, the ends of the conductors 6 of the main level of wiring are made flared and provided with openings 12 at points of their interconnection with the conductor 3. Hemispherical recesses 13 are formed in the metal of the substrate 1 (FIG. 2a) under the openings 12 in the course of pre-etching the base. Upon lamination of the base 7, the dielectric material 10, which is under pressure and in yield condition, flows in the recesses 13 to form "rivets" 14 therein (FIGS. 2b,c). Thereby, the support elements 8, as well as the conductors 5 and 6, get split-joined with the dielectric material of the layer 10.

Provided all of the afore-listed requirements are satisfied, a highly reliable panel can be manufactured, capable of withstanding thermal cycling starting from cryogenic temperatures and most severe mechanical effects while maintaining the integrity of the structure and all of the electrical parameters of wiring at the desired level. In such panels, the reliability of interconnections between conductors in different levels of wiring proves as good as that in a single conductor, which cannot be attained in panels manufactured according to prior art processes.

The materials for the substrate 1 and conductors 3–6 include commonly used metals which satisfy the requirement of selective etching of the substrate metal with respect to the conductor metal. When manufacturing extra-reliable panels, it is expedient that said metals would form a continuous series of solid solutions with one another.

A technically favorable pair of metals includes copper for substrate and nickel for conductors. Copper is etched selectively with respect to nickel in etching reagents on the basis of chromic anhydride and sulfuric acid or in ammoniate solutions. The various copper-based alloys, in particular, brass and bronze, may be used instead of copper.

In the case of mass-produced articles, with the cost requirements being of major importance, use can be made of an iron substrate in the form of a sheet or ribbon of low-carbon steel. Such a substrate is etched selectively with respect to copper or nickel conductors in etching reagents on the basis of oxalic acid and hydrogen peroxide. The substrate may also be formed of aluminum, in which case, however, an electrically conducting conversion layer is to be formed on the surface of the aluminum substrate prior to the electroplating of the conductor metal, for example, a fluoride-phosphate film ensuring an adequate adhesion of conductors to the substrate and effecting the electrical contacts between the levels of wiring but slightly. It is most practical to etch the aluminum substrate in alkaline etching reagents.

The panel conductors may have a multilayer structure, for instance, the nickel base may be gold-plated to improve weldability and electrical conductivity, coated with tin to facilitate soldering or silver-plated in the case of especially strict requirements of the wiring conductivity. In spite of the fact that silver has an adverse effect upon reliability and durability of conventional printed circuit boards due to its high migratory capacity, this effect is reduced to a minimum in the case of the structure shown in FIG. 2b and silver can be used without reservations whenever required, as in the case of manufacture of microelectronic systems operating on frequencies of several hundred MHz.

The extension of technical capabilities of the herein disclosed process, leading to its applicability for the manufacture of large-size panels employing the base of any type such as rigid, flexible, flexible-rigid or a base with built-in heat dissipator, is attained owing to the fact that the wiring proper is manufactured separately from the base on a metal substrate while the base itself may present a composite structure. To this end, it should be formed of at least two layers, with at least one of said layers, adjoining the panel base, being made of dielectric material. The remaining layers may be made of metal, dielectric or combinations thereof.

It is expedient that in the layer adjoining the base holes be formed in the panel areas designed to accommodate thermal elements of microelectronic systems and/or interconnections with the subsequent layer.

The above-described structure (FIG. 2) is illustrative of one of the most characteristic and practically important cases of a composite base wherein the layer 10 of dielectric material is immediately followed by the metal base 7. Such a panel is characterized by good thermal properties and high mechanical strength.

In the case of rigid assembly of microelectronic components on a panel, the base 7 should be made of metal featuring the coefficient of thermal expansion corresponding to that of the components, say, of ferronickel alloy. If that is not required, it is best to use anodized aluminum plate or special aluminum section with ribbed or pin projections for improved heat transfer.

If the layer 10 is made extending beyond the base 7, then, given adequate flexibility of the dielectric material, a flexible-rigid structure will be formed wherein the system components may be assembled within the base limits while the layer 10 of dielectric material extending outside the limits of the base 7 forms flexible stubs for interconnection with external circuits.

Figure 3:
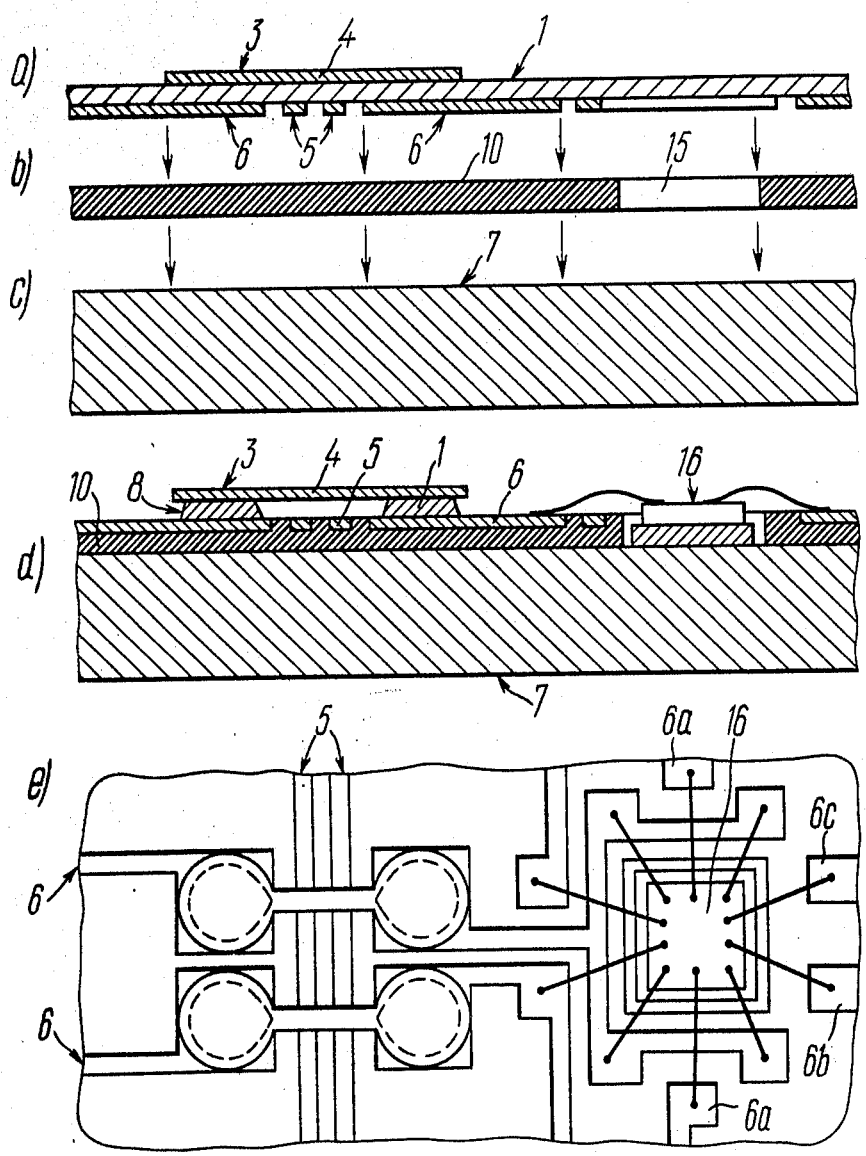
FIGS. 3a, b, c, d, e illustrates the various stages of the process for manufacturing panels with a composite metal-dielectric base, according to the invention.

It is expedient that the layer 10 of dielectric material be formed of an adhesive film which is interlaid between the base 7 and metal substrate 1 prior to the base lamination step (FIGS. 3a, c). Spacers are pre-formed from the adhesive film (FIG. 3b) which have, in addition to the afore-mentioned holes 15, base perforations for convenient matching with the metal substrate 1. When placed between the metal substrate 1 with the conductors 3–6 and the base 7, the spacers of dielectric material leave, at the level of the holes 15, bare portions of the metal base 7 designed to accommodate thermal elements 16 of microelectronic systems (FIGS. 3d, e). Said bare portions may further be used for effecting the electrical contact with the metal of the base 7. FIG. 3 illustrates the way to effect the interconnection of the element 16 with the conductors 6, 6a, 6b, 6c.

Adhesive films can be provided by glass fiber- or polyimide-based compounds impregnated or coated with an adhesive composition in a solid state retaining its reactivity.

Given moderate requirements placed upon the electrical characteristics of panel and mild operating conditions, the adhesive film may be provided by a single layer of fiber glass fabric impregnated with hot-curing epoxy resin and heat-treated after impregnation to thermally reversible state.

In the case of panels characterized by a high density of conductor pattern of the wiring and designed to operate under severe conditions, the adhesive film should have a polyimide base coated on both sides with layers of a high-temperature adhesive.

The temperature conditions of the base lamination step are selected from the standpoint of the adhesive compound transition to thermally irreversible state (total polymerization in the case of epoxy adhesive compounds) or its softening. The presssure applied should provide for good bonding and for the flowing of the adhesive compound under the overhanging edges 9 of the conductors 5–6 of the main level of wiring.

Figure 4:
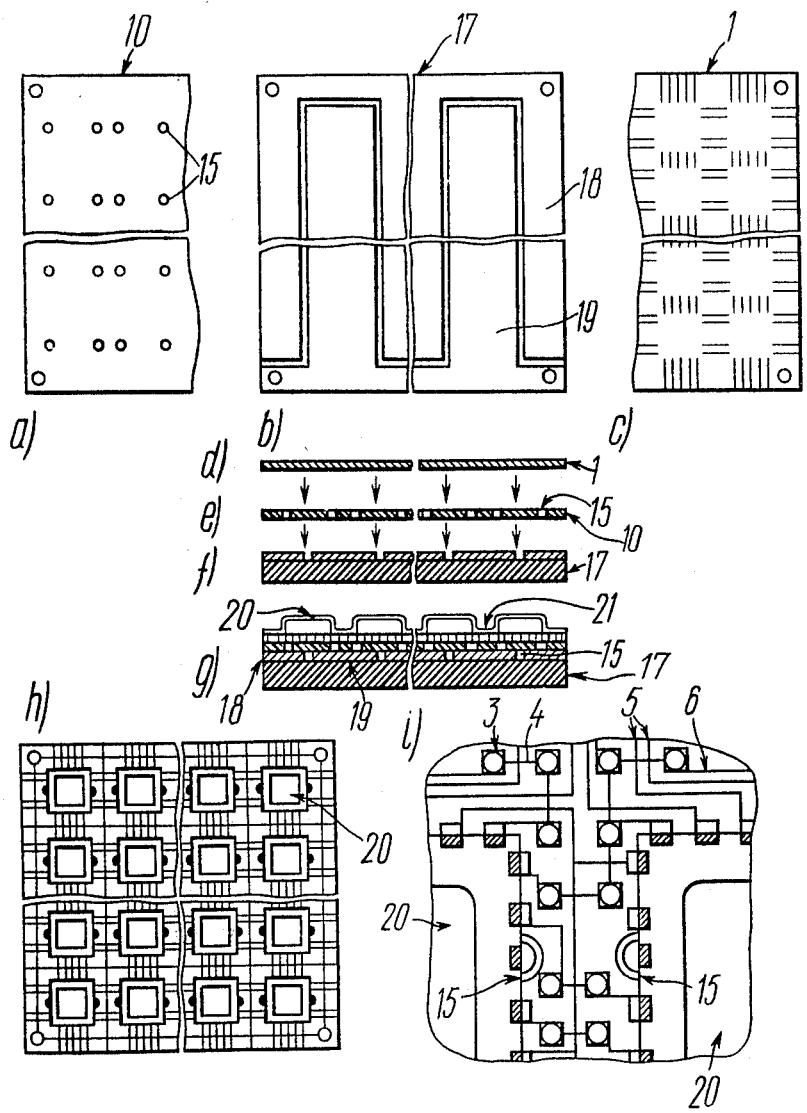
FIGS. 4a, b, c, d, e, f, g, h, i illustrates the various stages of the process for manufacturing panels with a composite base comprising a printed circuit board with the wiring of "ground" and "supply" circuits, according to the invention.

In the case of sophisticated microelectronic systems, it is practical to have a circuit panel with more than two levels of wiring (FIG. 4). This problem may also be solved through the use of a composite base laminated, via the layer 10 of dielectric material with the holes 15 provided in the requisite spots (FIGS. 4a,d), onto the metal substrate 1 with the conductors 3–6.

Three and more levels of wiring may be obtained if the layer following the dielectric layer adjoining the panel base is formed of a pre-fabricated board. Of practical interest to highly sophisticated digital systems is the case when a composite base incorporates a pre-fabricated printed circuit board which may be single-sided and even have no metallized holes in the case of superficial wiring of the system elements (FIGS. 4b, f).

As a rule, a digital microelectronic system comprises a considerable number of integrated circuits with complex wiring of logic circuits and simple wiring of the "ground" and "supply" circuits.

From this it follows that the high density of conductor pattern of the panel and several, at least two, levels of wiring are only required for logic circuits while the "supply" and "ground" circuits are to satisfy different requirements, namely, those of the minimum ohmic resistance of conductors and the performance of screening functions. Therefore, said circuits may be extended, without the loss of density of the system layout, to a single-sided printed circuit board with wide conductors filling the maximum possible portion of the board surface.

The conductor pattern of a printed circuit board 17 accommodating the "ground" and "supply" circuits (FIGS. 4b, f) may present two opposing comb structures 18 and 19, to one of which the supply voltage is applied, the other one being grounded. Under conditions of adequate electrical capacitance between said structures, each one of the latter will be equivalent to "ground" for the logic circuits owing to which said circuits (FIGS. 4c,d) will pass above the grounded surface, which is advantageous from the viewpoint of circuit manufacture.

Digital integrated circuits 20 in plastic or ceramic carriers are assembled at the boundary between the structures 18 and 19, owing to which the appropriate leads from each one of the integrated circuits 20 may be connected via the holes 15 in the layer 10 of dielectric material both with the structure 18 and the structure 19 (FIGS. 4g,h,i).

The wiring of logic circuits is effected by the afore-mentioned technique on the metal substrate (FIGS. 4c, d). Following the assembly of integrated circuits, the panel is coated with a layer 21 of varnish. The resulting three-level circuit panel is optimum for a digital system owing to differentiated density of the conductor pattern of the levels of wiring and unified technology of manufacture. The unity of manufacturing technology is ensured by the identical nature of main production steps in manufacturing both the wiring of logic circuits and the printed circuit board of the wiring of the "ground" and "supply" circuits. The density of the conductor layout of digital system in such a panel may be the same as in a thin-film microcircuit while requiring no costly materials and vacuum production steps for manufacture.

If required, load and matching resistors may be provided on a printed circuit board by mask printing them using low-temperature resistive compounds.

For manufacturing a sophisticated microelectronic system employing such panels, the minimum amount of equipment and machine-tool attachments is required because the integrated circuits of a single series incorporated in the system are, as a rule, characterized by a similar arrangement of the "ground" and "supply" leads. This enables one to use a single type of printed circuit board and a single type of adhesive spacer with holes for forming a layer of dielectric material, while ensuring the diversity of circuit panels for use in the various logic units of the system by replacing only the metal substrate with the conductors of logic circuit wiring.

A composite base may have a second system of conductors on metal substrate, analogous with that described above. This will result in a panel circuit with four-level wiring, designed for double-sided assembly of system elements. Such a panel is of interest in the case of sophisticated microelectronic systems of minimum volume and weight characterized by low level of power consumption.

Other combinations of structures and materials are possible in the composition of panel base, which are selected depending on the specific nature of the component base and degree of integration of the microelectronic system for the manufacture of which the given panel is to be used.

For example, if a system comprises a considerable number of passive components involving thin- or thick-film technology, the pre-fabricated board incorporated in the base may present a ceramic or glass plate including a set of film components incorporated in the system. Under conditions of high level of dissipated power, it is best to use an anodized aluminum plate for the purpose.

In digital systems, use can be made of pre-fabricated printed circuit boards with metallized holes or even of multilayer printed circuit boards whose external layers are formed by the afore-described technology. Rather than being a mere combination of circuit panels of several types, such a structure will present a circuit panel characterized by qualitatively novel capabilities possessed by none of its components taken singly. It will also present a particular case of a unified circuit panel for printed board assemblies and hydrid-film microcircuits, combining the capabilities of both said structures and free of the main disadvantage of each one of said structures taken singly, i.e., different production bases and equipment used for their manufacture.

Presented below are specific examples illustrating the embodiment of the herein disclosed process.

It is practical to divide such illustrative examples in two groups, the first group including Examples 1 to 3 related to the preparation of the structure of two-level wiring on metal substrate, and the second group—Examples 4 to 8 describing the preparation, on the basis of said structure, of finished circuit panels and their use in systems.

EXAMPLE 1

The manufacture of a panel with two-level wiring, using photolithographic techniques A substrate of 0.05 mm copper foil with a pre-treated (deoxidized and degreased) surface is immersion-coated on two sides with a layer of photoresist 0.004–0.006 mm thick. After that, said substrate is placed between two pre-aligned masks on flexible film or glass plate and irradiated on two sides with ultraviolet light while making sure that the exposure corresponds to the type of photoresist used. The pattern on the masks corresponds to the layout of conductors of the main level or wiring 0.025 mm wide, with the conductors spaced 0.05 mm from each other. The constricted portions of conductors of the second level of wiring also have a width of 0.025 mm and terminate, at points of contact with the main level of wiring, in disks 0.1 mm in dia.

The photoresist is developed and hardened, after which the substrate is placed in a nickel-plating bath with sulfamine electrolyte ensuring pliable unstressed deposits and a high build-up rate. Nickel is deposited to a conductor thickness of 0.015 mm. Then, the photoresist that is no longer necessary is removed and the substrate is pre-etched in an etching reagent on the basis of chromic anhydride and sulfuric acid to a depth of 0.01 mm. The substrate is annealed in an inert gas medium at a temperature of 850° C. for 15 minutes.

The base is made of an anodized aluminum plate 0.05 mm thick and laminated with a polyimide film coated on two sides with layers of organolfluoric adhesive. The lamination is done under a pressure of 50–75 kgf/cm$^2$ at a temperature of 450° C. Final etching is performed in an etching reagent on the basis of chromic anhydride and sulfuric acid across the entire thickness of the substrate until complete removal of copper from under crossover points.

After etching, the panel is washed in deionized water using ultrasound and dried with infrared rays. The panel is now ready for assembling components with wire leads by thermocompression or ultrasonic welding. Structurally, a microelectronic system in the manufacture of which the given panel is used presents a hybrid integrated circuit featuring a high degree of integration.

EXAMPLE 2

The manufacture of a panel with two-level wiring, using no photolithographic techniques but involving a direct transfer of the conductor pattern onto a metal substrate It is not practical to employ photolithographic techniques when manufacturing small lots of highly sophisticated and varying circuit panels. The optimum utilization of the possibilities offered by computer-aided design of system topology is attained through direct use of the design data for transferring the conductor layout pattern onto a metal substrate.

To this end, a substrate analogous to that described in Example 1 is immersion-coated on two sides with layers of chemically resistant varnish 0.04–0.06 mm thick.

Thereupon, a finely focused laser beam is employed, utilizing the reflecting properties of the metal substrate, to selectively burn out the varnish on both sides of the substrate thus stripping bare the surface of future conductors. After that, the substrate is blasted with purified compressed air, washed in deionized water using ultrasound and further subjected to the series of operations, starting with nickel plating, analogous to those described in Example 1.

EXAMPLE 3

The manufacture of a panel with two-level wiring using no photolithographic techniques but involving offset printing It is expedient to use this technique in the manufacture of large series of circuit panels of low and medium complexity characterized by not so high a density of conductor pattern of the wiring.

In this case, the forming of a protective mask on a metal substrate analogous to that described in Examples 1 and 2 is done by transferring a chemically resistant paint from a printing plate to the substrate with the aid of a rubber plate, the subsequent procedure being analogous with that described in Example 1.

Since the transfer is accompanied by a loss of accuracy of the conductor dimensions as compared with the printing plate, the width of any conductor portions cannot, as a rule, be less than 0.1 mm. In case such restriction is permissible, the present technique is preferred owing to its higher efficiency.

EXAMPLE 4

The manufacture of a circuit panel on a flexible base with two levels of wiring

Following the manufacture of metal substrate with conductors formed on both sides thereof, according to any one of Examples 1 to 3, a polyimide film coated on one side with a layer of weldable organofluoric polymer is used as a base. If the metal substrate is shaped as a ribbon, it is practical that the lamination be performed while the substrate and the polyimide film facing it by the weldable layer are moved between heated rollers.

The resulting laminate is subjected to selective etching of the metal substrate and washing, which concludes the cycle of manufacturing a circuit panel on a flexible base.

EXAMPLE 5

The manufacture of a circuit panel on a flexible base with four levels of wiring The procedure is analogous to that described in Example 4, except for the fact that the base is formed from a perforated polyimide film coated on both sides with layers of weldable organofluoric polymer. Laminated on both sides on that film are metal substrates with conductors formed on both sides thereof in accordance with any one of Examples 1 to 3. The conductor pattern of the metal substrates is formed in accordance with the topologies of the first and second pairs of wiring levels.

EXAMPLE 16

The manufacture of a circuit panel on a flexible base with three levels of wiring, of which the third level represents a "ground" or "supply" bus The procedure is analogous with that described in Example 5, except for the fact that the second metal substrate with conductors formed on both sides thereon is replaced with a metal ribbon 0.05–0.1 mm thick made of a metal resistant to the etching reagent affecting the substrate.

Said metal ribbon is further used as a "ground" or "supply" bus, the contact therewith being effected via perforations provided in the polyimide film.

EXAMPLE 7

The manufacture of a circuit panel on a composite flexible-rigid base with a built-in heat dissipator The procedure is analogous to that described in Example 6, except for the fact that the metal ribbon is replaced with aluminum plates 0.5–2.0 mm thick having smaller dimensions than the perforated polyimide film. Said plates will accommodate on generally flexible boards a rigid heat-dissipating portion designed for the assembly of system components.

In the case of high power extraction, it is practical to replace the aluminum plates with special aluminum sections with a developed surface on one of the sides thereof.

EXAMPLE 8

The use of manufactured circuit panels in systems

Of major importance in the use of circuit panels in systems is the arrangement of external and internal leads, on which the mating of the panel with external circuits depends and which places certain requirements upon the component base of the system.

Figure 5:
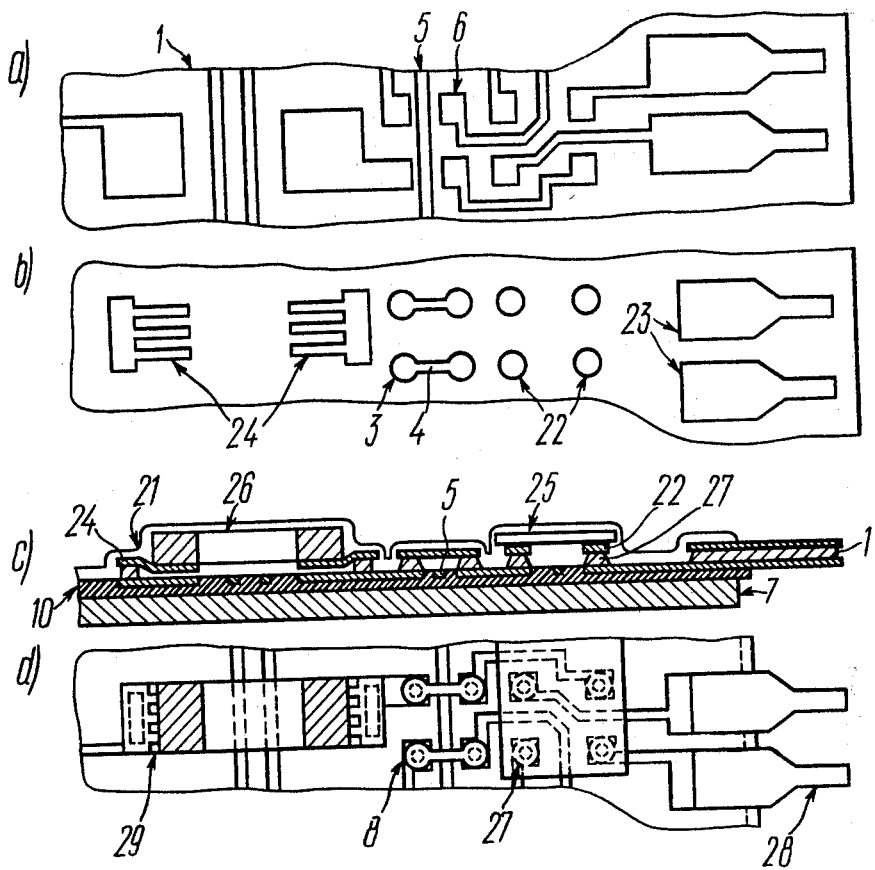
FIGS. 5a, b, c, d illustrates the use of a panel manufactured by the process according to the invention in microelectronic systems, under conditions of the various embodiments of external and internal leads in a single manufacturing cycle with the wiring.

A fragment of a microelectronic system employing a panel circuit with external and internal leads of the various types, manufactured according to the process of the invention, is shown in FIG. 5.

The main specific feature of said system consists in that the leads of all types used in the system have been manufactured in a single production cycle with the levels of wiring, and no additional operations were required for their manufacture and attachment. The leads, similar to the conductors 3–6, are configured simultaneously on both sides of the metal substrate 1 (FIGS. 5a,b).

Stack-like internal leads 22 are made as separate disks on the side of the metal substrate 1 opposite to that on which the base 7 is laminated.

Ribbon like external leads 23 are made as identical shapes on the opposite sides of the substrate 1, extending beyond the base 7 (FIG. 5c).

Special internal leads 24 which help preclude the disturbance of contacts due to the ever present discrepancy between the coefficients of thermal expansion of materials of the base 7 and system components, are made in the form of combs on the side of the metal substrate 1 opposite to that on which the base 7 is laminated. The width of the comb teeth is made equal to the width of the constricted portions 4 of the conductors 3. A subboard 25 is subsequently mounted on the leads 22, and a component 26—on the leads 24 (FIGS. 5c,d).

Following the lamination of the base 7 and selective etching of the substrate 1, stacks 27 of the metal of the substrate 1 are formed under the disks of the leads 22, said stacks being analogous with the support elements 8 effecting the contact between the levels of wiring. The ribbon-like leads 23 assume mechanical strength thanks to the provision in their middle portion of ribbons 28 of the metal of the substrate 1. After etching, the teeth of the combs 24 hang freely over support elements 29 formed from the metal of the substrate 1 under the edges of the special internal leads.

During the assembly of the components 26, said teeth sag down to the panel base, owing to which they assume the properties of springs taking upon themselves the variations in the dimensions of rigid links as a result of thermal effects upon the system. The resistance of such leads to impact and vibration loads is ensured by the layer 21 of varnish which, on the one hand, should be sufficiently rigid for adhesion of the components 26 to the panel surface and, on the other hand, should feature a certain degree of elasticity to maintain the flexibility of the leads 24. Such requirements are best satisfied by dielectric compounds on the basis of organosilicon rubber.

Apart from the leads of the afore-mentioned types, a circuit panel manufactured by the herein disclosed process always has a second assembly surface which it is practical to use for welding out the leads by thermocompression or ultrasound. The use of said second assembly surface is illustrated in FIG. 3.

The principal advantage of the herein disclosed process resides in the elimination of steps of manufacturing and metallizing interlevel contacts, unavoidable in prior art processes for providing multilevel wiring, and in the provision of a single structural and production basis for the manufacture of printed board assemblies and hybrid microcircuits. This provides a possibility of:

reducing the amount of labor consumed in the course of system nanufacture by 35–75%, depending upon the degree of complexity of the system;

increasing the density of the system layout by a factor of 5–10 as compared to printed wiring, and by a factor of 1.5–2 as compared to thick-film technique;

improving the system reliability;

obviating or reducing to a minimum the use of noble metals and costly materials.

The cost of boards proper may be reduced by more than 50%, with due consideration for the various types of boards which may be replaced by a unified board manufactured by the herein described technique.

An important advantageous feature of the herein disclosed process resides in that it enables one both to obviate the use of some panels and to provide practically any of the available types of circuit panels with qualitatively novel capabilities which can be realized in a noval panel with a composite base.

The herein disclosed process based on electroplating and chemical etching techniques involves the use of liquid chemical reagents, however, it features considerably greater technical capabilities and versatility than the "dry" processes used in hybrid technology. The process of the invention is used to manufacture a qualitatively novel panel comparable with a printed circuit board only in what regards its manufacturing technology and low cost while the technical capabilities of said new panel are on a par with those of the much costlier precision panels for hybrid integrated circuits.

What is claimed is:

1. A process for manufacturing a printed circuit board having at least two conductor layers, comprising the steps of:

disposing first and second masks on first and second opposed major surfaces of a substantially planar substrate comprising a metal etchable in a given etchant;

a first electrodeposition step of selectively electrodepositing a first layer comprising a first conductor pattern including bridging elements on said first major surface of said substrate through said first mask, said first layer comprising a metal substantially impervious to said etchant;

a second electrodeposition step, carried out simultaneously with said first electrodeposition step, of selectively electrodepositing a second layer comprising a second conductor pattern, including conductor elements below and oriented transverse to said bridging elements, on said second major surface of said substrate through said second mask, said second layer comprising a metal substantially impervious to said etchant;

said bridging elements having enlarged ends and a constricted portion between said enlarged ends;

removing said first and second masks from said substrate; pre-etching said second major surface of said substrate by immersing the same in said etchant, to etch said second major surface to a depth in the range of 0.01 to 0.5 times the width of said conductor elements comprising said second layer;

thereafter immersing said substrate and the first and second layers thereon in said etchant for a sufficient time so that said etchant removes the exposed portions of said substrate below said constricted portions of said bridging elements throughout the entire thickness of the substrate thereat; and securing an adhesive layer comprising an insulating material to said second layer so that said second layer becomes imbedded in one major surface of said adhesive layer, and securing the other major surface of said adhesive layer to one major surface of a base having two major surfaces.

2. The process according to claim 1, comprising the additional step of, just prior to said securing step, annealing the remaining portions of said substrate and said first and second layers.

3. The process according to claim 1, wherein said base is provided with through holes for accomodating thermal elements.

4. The process according to claim 1, wherein a metal layer is secured to the other major surface of said base.

5. The process according to claim 1, wherein said base comprises a second metal substrate on both sides of which additional conductor layers are disposed, at least one of said additional conductor layers having at least one constricted portion, said base also being immersed in said etchant during said immersing step, for a sufficient time so that the exposed portions of said second substrate under each said constricted portion are removed throughout the entire thickness thereof.

* * * * *